United States Patent [19]

Kondo et al.

[11] Patent Number: 5,087,296
[45] Date of Patent: Feb. 11, 1992

[54] SOLAR BATTERY AND PROCESS FOR PREPARING SAME

[75] Inventors: Shigeki Kondo, Hiratsuka; Hidemasa Mizutani, Sagamihara, both of Japan

[73] Assignee: Canon Kabushiki Kaisha, Tokyo, Japan

[21] Appl. No.: 610,310

[22] Filed: Nov. 8, 1990

Related U.S. Application Data

[63] Continuation of Ser. No. 537,146, Jun. 12, 1990, abandoned, which is a continuation of Ser. No. 291,329, Dec. 28, 1988, abandoned, which is a continuation of Ser. No. 147,227, Jan. 22, 1988, abandoned.

[30] Foreign Application Priority Data

Jan. 26, 1987 [JP] Japan .................. 62-014104

[51] Int. Cl.⁵ ............... H01L 31/06; H01L 31/18
[52] U.S. Cl. .................. 136/258; 136/261; 437/2; 437/4; 437/83; 437/967; 357/30; 357/59; 148/DIG. 122; 148/DIG. 152

[58] Field of Search ............ 136/258 PC, 261; 437/2, 437/4, 83, 966, 967; 148/DIG. 54, DIG. 122, DIG. 150, DIG. 152; 156/610, 612; 357/30 J, 30 K, 59 D

[56] References Cited

U.S. PATENT DOCUMENTS 3,620,833 11/1971 Gleim et al. .................. 437/62
4,657,603 4/1987 Kruehler et al. ............... 437/83
4,677,250 6/1987 Barnett et al. ................. 136/258

Primary Examiner—Aaron Weisstuch
Attorney, Agent, or Firm—Fitzpatrick, Cella, Harper & Scinto

[57] ABSTRACT

A solar battery comprises a substrate, a first semiconductor layer of a first conduction type comprising a single crystal singly grown on a nucleation surface ($S_{NDL}$) formed on the surface of said substrate as the base for growing, said nucleation surface ($S_{NDL}$) being comprised of a material which is sufficiently greater in nucleation density (ND) than the material constituting the surface of said substrate and having a sufficiently fine area such that only a single nucleus grows, a second semiconductor layer of a second conduction type different than the conduction type of said first semiconductor layer and means for taking out the power.

18 Claims, 10 Drawing Sheets

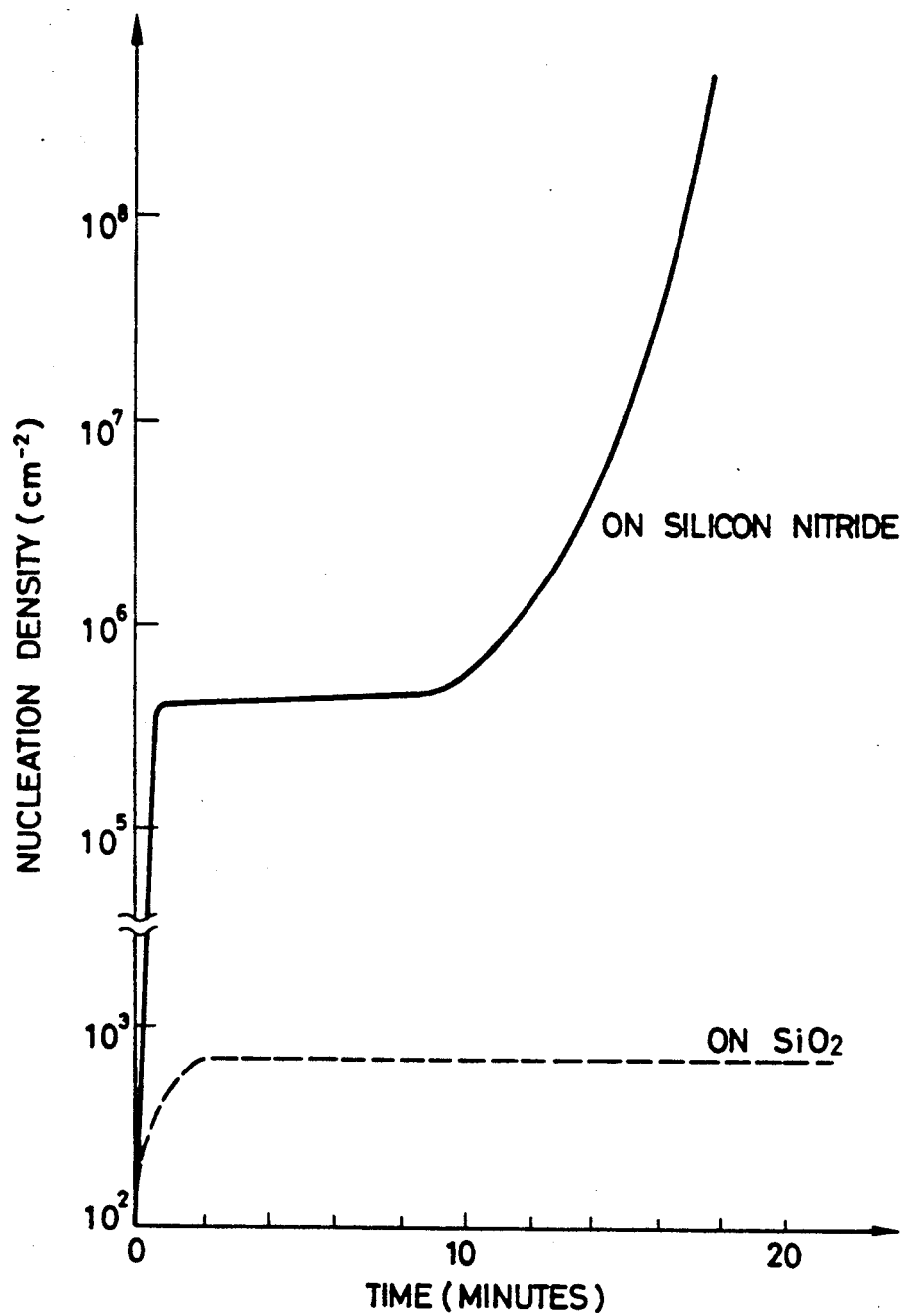

SOLAR BATTERY AND PROCESS FOR PREPARING SAME

This application is a continuation of application Ser. No. 07/537,146 filed June 12, 1990, now abandoned, which is a continuation of application Ser. No. 07/291,329 filed Dec. 28, 1988, now abandoned, which is a continuation of application Ser. No. 07/147,227 filed Jan. 22, 1988, now abandoned.

BACKGROUND OF THE INVENTION

1. Field of the Invention

This invention relates to a solar battery and a process for producing the same, particularly to a solar battery which has a good energy conversion efficiency and can be formed with excellent productivity over a large area and a process for producing the same.

2. Related Background Art

In various instruments, solar batteries have been utilized as the driving energy source.

Solar batteries use a p-n junction for the functional portion and silicon is generally employed as the semiconductor material constituting the p-n junction. Although it is preferable to use single crystalline silicon with respect to efficiency to convert photoenergy to electromotive force, amorphous silicon has been deemed to be more advantageous with respect to enlargement of area and reduction in cost.

In recent years, use of polycrystalline silicon has been investigated for the purpose of obtaining low cost comparable to amorphous silicon and high energy conversion efficiency comparable to single crystalline silicon. Whereas, according to the method proposed in the prior art, a mass of polycrystalline silicon has been sliced into a plate for use, and therefore it was difficult to make the thickness 0.3 mm or less, whereby the dose of light to reach the p-n junction cannot be sufficiently ensured and the energy conversion efficiency was not sufficient in this respect. Thus, it is required to make the thickness thinner for enhancement of the efficiency.

Accordingly, it has been attempted to form a thin film of polycrystalline silicon by utilizing a thin film forming technique such as chemical vapor deposition (CVD) method, etc., but the crystal grain size can become at most some hundredth microns, and the energy conversion efficiency is lower even when compared with the mass polycrystalline silicon slicing method.

Also, it has been attempted to enlarge the crystal grain size by melting the polycrystalline silicon thin film formed according to the above CVD method by irradiation with a laser beam followed by recrystallization. However, this method is not satisfactory in reduction of cost and also stable production can be done only with difficulty.

SUMMARY OF THE INVENTION

Accordingly, an object of the present invention is, in view of the prior art techniques as described above, to provide a solar battery with good energy conversion efficiency and a process for preparing the same.

Further, another object of the present invention is to provide a solar battery which can be made sufficiently thin, whereby good energy conversion efficiency can be obtained and a process for preparing the same.

Still another object of the present invention is to provide a polycrystalline type solar battery with further improved energy conversion efficiency and a process for preparing the same.

Further, still another object of the present invention is to provide a process which can prepare a solar battery as mentioned above a low cost and stably.

According to the present invention, there is provided a solar battery comprising a substrate, a first semiconductor layer of a first conduction type comprising a single crystal singly grown on a nucleation surface ($S_{NDL}$) formed on the surface of said substrate as the base for growing, said nucleation surface ($S_{NDL}$) being comprised of a material which is sufficiently greater in nucleation density (ND) than the material constituting the surface of said substrate and having a sufficiently fine area such that only a single nucleus grows, a second semiconductor layer of a second conduction type different than the conduction type of said first semiconductor layer and means for outputting the power.

BRIEF DESCRIPTION OF THE DRAWINGS

FIG. 3 is a graph showing the change with lapse of time of nucleation density (ND) on the deposition surface of $SiO_2$ and the deposition surface of silicon nitride;

DETAILED DESCRIPTION OF PREFERRED EMBODIMENTS

For a better understanding of the present invention, first the general process for forming a thin film of semiconductor material is explained.

When the deposition surface is made of a material different in kind from the impinging atoms, particularly an amorphous material, the impinging atoms are diffused freely on the substrate surface, or again evaporated (released). And, as the result of mutual collision between the atoms, a nucleus is formed and when its size becomes the size rc ($= -2 \sigma/gv$) at which its free energy G becomes a maximum (critical nucleus), G is reduced and the nucleus continues to grow stably three-dimensionally to become shaped as an island. The nucleus with the size exceeding rc is called a stable nucleus, and unless otherwise particularly noted, "nucleus" in the following basic description of the present invention refers to this "stable nucleus". Also, among "stable nucleus", those with small r are called "initial nucleus".

The free energy generated by formation of the nucleus is represented as follows:

$$G = 4\pi f(\theta)(\sigma o \cdot r^2 + \tfrac{1}{3} g v \cdot R^3)$$

$$f(\theta) = \tfrac{1}{4}(2 - 3\cos\theta + \cos^2\theta)$$

wherein,
r: radius of curvature of nucleus
θ: contact angle of nucleus
gv: free energy per unit volume
θo: surface energy between nucleus and vacuum.

Figure 1:
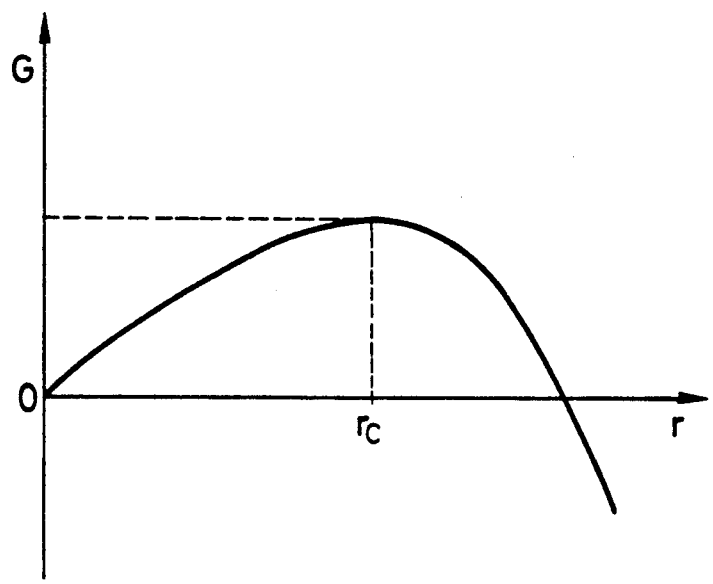
FIG. 1 is a graph for illustration of the relationship between the size of nucleus rc and free energy G in the process of forming thin film.

FIG. 1 shows the manner in which G is changed. In the same Figure, the radius of curvature of the stable nucleus when G is at the maximum value is rc.

Thus, nuclei grow to become shaped as islands, and further grow whereby mutual contact between islands progresses until sometimes coalescence occurs and via a network structure, they finally become a continuous film which completely covers the substrate surface. Following such a process, a thin film is deposited on the substrate.

In the deposition process as described above, the density of nuclei formed per unit area of the substrate surface, the size of nuclei and the nucleation speed are determined depending on the state of the system of deposition, and particularly the interaction between the impinging atoms and the substrate surface material is an important factor. Also, a specific crystal direction grows in parallel to the substrate due to anisotropy of the interface energy relative to the crystal surface at the interface between the deposited material and the substrate, and when the substrate is amorphous, the crystal direction within the substrate plane is not constant. For this reason, grain boundaries are formed by mutual collision between nuclei or islands, and particularly in the case of mutual collision mutually between islands with some sizes or greater, grain boundaries are formed rather than occurrence of coalescence. Since the grain boundaries formed are difficulty movable in the solid phase, the grain sizes are determined at that point.

Next, the selective deposition method for forming a deposited film selectively on the deposition surface is to be described. The selective deposition method is a method in which a thin film is formed selectively on the substrate by utilizing the differences between the materials in factors influencing nucleus formation in the thin film forming process, such as surface energy, attachment coefficient, release coefficient, surface diffusion speed, etc.

Figure 2A:
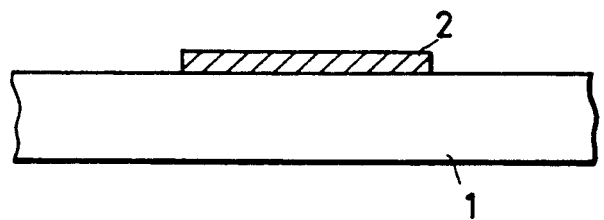
FIGS. 2A and 2B are illustrations of the selective deposition method.
Figure 2B:
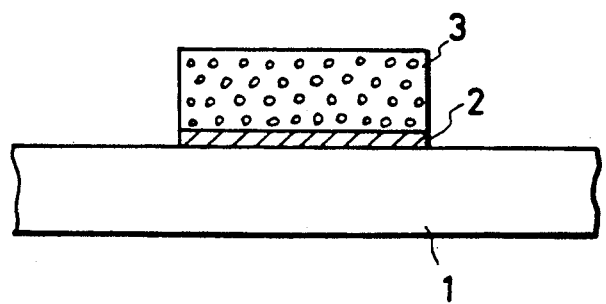

FIGS. 2A and 2B are illustrations of the selective deposition method. First, as shown in FIG. 2A, on the substrate 1, a thin film 2 comprising a material different in the above factors from the substrate 1 is formed at a desired portion. And, when deposition of a thin film comprising an appropriate material is effected under appropriate deposition conditions, a thin film 3 grows only on the thin film 2, whereby it is possible to give rise to a phenomenon that no growth occurs on the substrate 1. By utilizing this phenomenon, a self-matching formed thin film 3 can be grown, whereby it becomes possible to omit the lithographic step by use of a resist as practiced in the prior art.

As the materials for enabling deposition according to such selective formation method, for example, $SiO_2$ may be used as the substrate 1, Si, GaAs, or silicon nitride as the thin film 2 and Si, W, GaAs, InP, etc., as the thin film 3 to be deposited.

FIG. 3 is a graph showing the change with lapse of time of nucleation density (ND) on the deposited surface of $SiO_2$ and the deposited surface of silicon nitride.

As shown in the same graph, soon after initial deposition, the nucleation density (ND) on $SiO_2$ is saturated at $10^3$ cm$^{-2}$ or less, and the value is not substantially changed even after 20 minutes.

In contrast, on silicon nitride ($Si_3N_4$), it is quickly saturated at about $4 \times 10^5$ cm$^{-2}$ or less, is not substantially changed 10 minutes thereafter, but is abruptly increased thereafter. This measurement example shows the case in which $SiCl_4$ gas is diluted with $H_2$ and deposited according to the CVD method under the conditions of a pressure of 175 Torr and a temperature of 100° C. The same result can be obtained by use of $SiH_2Cl_2$, $SiHCl_3$, $SiF_4$, etc., as the reaction gas, and controlling the pressure, temperature, etc. Also, vacuum vapor deposition can be employed.

In this case, nucleation on $SiO_2$ poses substantially no problem, but by addition of HCl gas into the reaction gas, nucleation on $SiO_2$ can be further suppressed to make deposition of Si on $SiO_2$ absolutely zero.

Such a phenomenon depends greatly on the difference in adsorption coefficient, release coefficient, surface diffusion coefficient, etc., relative to Si of the surfaces of $SiO_2$ and silicon nitride, but the fact that $SiO_2$ itself is etched by the reaction of $SiO_2$ with Si atoms to form silicon monoxide with higher vapor pressure, while no such etching phenomenon occurs on silicon nitride, may be also considered to be a cause of selective deposition (T. Yonehara, S. Yoshioka, S. Miyazawa, *Journal of Applied Physics* 53, 6839, (1982).

Thus, by selecting $SiO_2$ and silicon nitride as the materials of the deposition surface and silicon as the material to be deposited, sufficiently great nucleation density difference (ΔND) as shown in the same graph can be obtained. Here, although $SiO_2$ is desirable as the material for the deposition surface, this is not limitative and sufficiently practical nucleation density difference can be obtained even by use of $SiO_x$ ($0 < x < 2$).

Of course, the present invention is not limited to these materials, but the difference in nucleation density (ΔND) may be $10^3$-fold or more as shown by the same graph, and satisfactory selective formation of deposited films can be done with the materials as exemplified below.

As another method for obtaining this nucleation density difference (ΔND), ions of Si or N may be implanted locally into the $SiO_2$ surface to form a region having excessive Si or N.

The present invention utilizes selective deposition based on such nucleation density difference (ΔND) and, by forming the deposition surface sufficiently finely so that a single nucleus may grow on the deposition surface of a different kind of material having sufficiently greater nucleation density than the material of the deposition surface, a single crystal can be grown selectively only at the site where such fine different kind of material exists.

In this connection, since selective growth of a single crystal is determined depending on the electronic state of the deposition surface, particularly the state of the dangling bonds, the material with lower nucleation density (for example, $SiO_2$) is not required to be a bulk material, but it may be formed only on the surface of any desired material, substrate, etc., to form the above deposited surface.

Referring now to the drawings, the embodiments of the present invention are described in detail below.

Figure 4A:
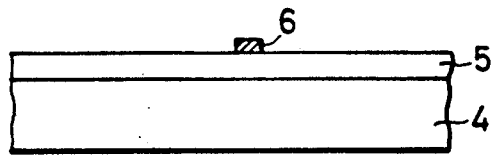
FIGS. 4A-4F illustrate diagramatically the steps of a first embodiment of the process for preparing the solar battery according to the present invention.
Figure 4E:
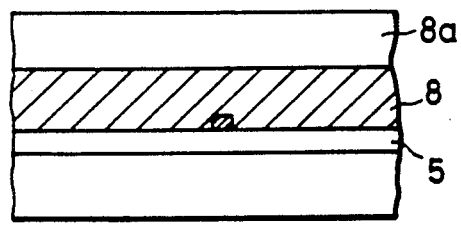
Figure 4B:
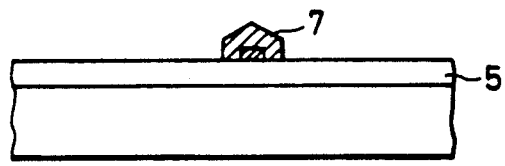
Figure 4F:
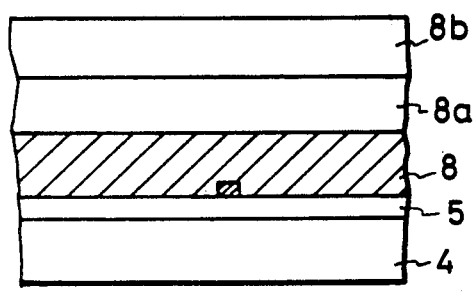
Figure 4C:
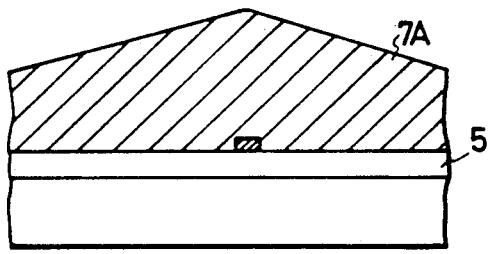
Figure 4D:
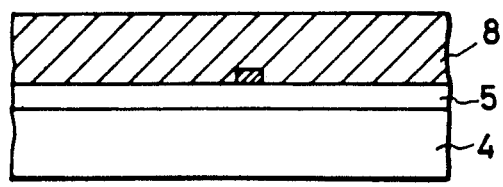
Figure 5A:
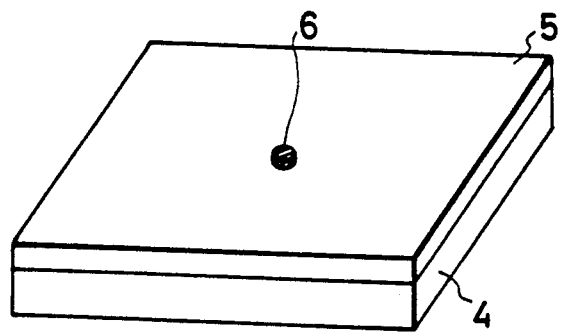
FIGS. 5A and 5B are perspective views of FIGS. 4A and 4D.
Figure 5B:
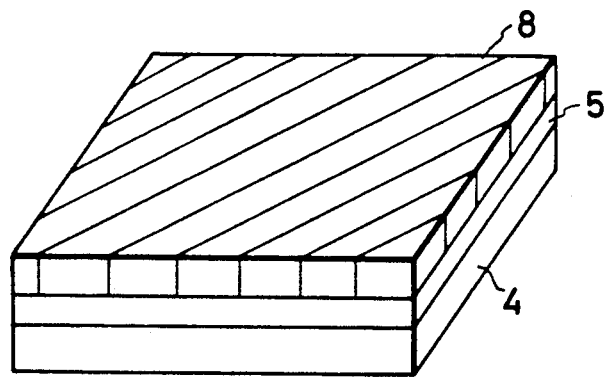
Figure 6A:
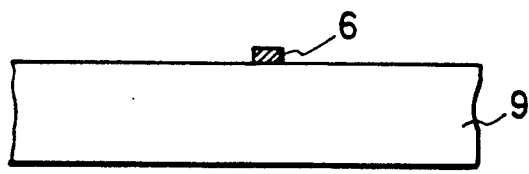
FIGS. 6A-6F illustrate diagramatically the steps of a second embodiment of the process for preparing the solar battery according to the present invention.
Figure 6B:
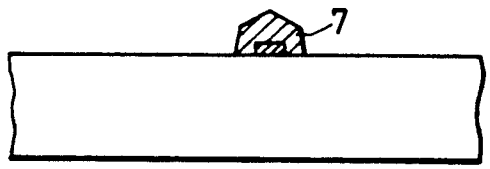
Figure 6C:
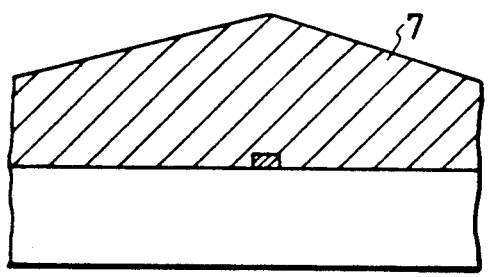
Figure 6D:
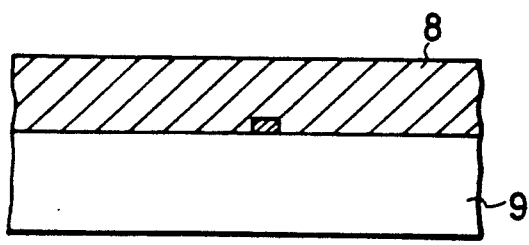
Figure 6E:
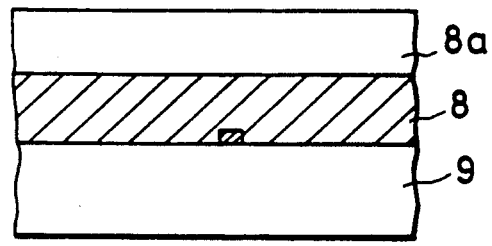
Figure 6F:
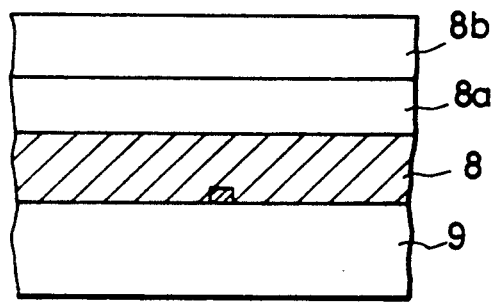

FIGS. 4A through 4F show diagramatically the steps of a first embodiment of the process for preparing the solar battery according to the present invention, and FIGS. 5A and 5B are perspective views of FIGS. 4A and 4D.

First, as shown in FIG. 4A and FIG. 5A, on the substrate 4 is formed a thin film 5 [nucleation surface ($S_{NDS}$)] with small nucleation density enabling selective nucleation, on which is deposited thinly a material of different kind than the material forming the thin film 5 with small nucleation density, and patterning is effected by lithography, etc. to form a nucleation surface ($S_{NDL}$) (often referred to as seed) 6 made of the material of different kind sufficiently finely. However, the size, the crystal structure and the composition of the substrate 4 may be as desired and it may be also a substrate having a functional element formed thereon or therein. Also, the nucleation surface ($S_{NDL}$) 6 made of the material of different kind is inclusive of modified regions containing excess Si, N, etc. formed by ion implantation of Si, N, etc. into the thin film 5, as described above.

Next, by selection of appropriate deposition conditions, a single nucleus of a thin film material is formed only on the nucleation surface ($S_{NDL}$) 6. That is, the nucleation surface ($S_{NDL}$) 6 is required to be formed sufficiently finely so that only a single nucleus may be formed thereon. The size of the nucleation surface ($S_{NDL}$) 6, which may differ depending on the kind of the material, may be several microns or less. Further, the nucleus grows while maintaining a single crystal structure to become a single crystal grain 7 in shape of an island as shown in FIG. 4B. For forming an island-shaped single crystal grain 7, it is desirable to determine the conditions so that no nucleation occurs at all on the thin film 5, as already mentioned.

The island-shaped single crystal grain 7 further grows while maintaining the single crystal structure with the nucleation surface ($S_{NDL}$) 6 as the center (lateral overgrowth), whereby it can cover over the whole thin film 5 as shown in FIG. 4C (single crystal 7A).

Subsequently, the single crystal 7A is flattened by etching or polishing, and a single crystal layer 8 capable of forming a desired element can be formed on the thin film 5 as shown in FIG. 4D and FIG. 5B.

For the thin film 5 forming the nonnucleation surface ($S_{NDS}$) on the substrate 4, any desired material can be used for the substrate 4 which is the supporting member. Further, in such a case, even if the substrate 4 may be one having a functional device, etc., formed thereon according to conventional semiconductor technique, the single crystal layer 8 can be easily formed thereon.

In the above embodiment, the nonnucleation surface ($S_{NDS}$) is formed of thin film 5, but a substrate comprising a material with small nucleation density (ND) enabling selective nucleation may be used as such and nucleation surfaces ($S_{NDL}$) may be provided at any desired position to form a single crystal layer similarly thereon as shown in FIGS. 6A–6D.

The single crystalline layer 8 is made the first electrode of the first conduction type (e.g. n-type) of a solar battery. More specifically, for example, after the step shown in FIG. 4D, an impurity such as P (phosphorus) or As (arsenic) is diffused similarly as in the case of a conventional IC preparation process, or ion implantation of these impurities is effected to make the above single crystalline layer 8 n-type. Introduction of an impurity into the single crystalline layer 8 can be also effected simultaneously with deposition by mixing a gas such as $PH_3$, $AsH_3$, etc. in the deposition gas when carrying out single crystalline growth in the steps of FIGS. 4B and 4C.

Next, on the single crystalline layer 8 of the first conduction type, according to the epitaxial growth technique used in conventional IC preparation process, as shown in FIG. 4E, a single crystalline layer 8a with relatively lower impurity concentration which becomes the intermediate layer of the solar battery is formed.

Subsequently, on the above intermediate layer 8a, according to the epitaxial growth technique, a single crystalline layer 8b is formed as shown in FIG. 4F. The single crystalline layer is made the second electrode layer of the solar battery, and is made the second conduction type (e.g. p-type). More specifically, for example, after the step shown in FIG. 4F, an impurity such as B (boron), etc. is diffused or ion implantation thereof is effected similarly as in the case of a conventional IC preparation process to make the above single crystalline layer 8b p-type.

As described above, by utilizing the thin film deposition technique, a very thin solar battery with each thickness of the first electrode layer 8, the intermediate layer 8a and the second electrode layer 8b being about several microns to several tenths of microns can be prepared.

The conduction type of the first electrode layer 8 and that of the second electrode layer 8b may also be made opposite to those as described above.

In the above embodiment, the material constituting the nucleation surface was formed of the thin film 5, but of course, as shown in FIGS. 6A–6D, a single crystalline layer may be similarly formed by use of a substrate consisting of the material with small nucleation density enabling selective deposition thereon.

FIGS. 6A–6F illustrate diagramatically the steps of a second embodiment of the present invention. As shown in the like Figures, by forming on a substrate 9 comprising a material with small nucleation density which enables selective deposition, a sufficiently fine nucleation surface constituted of the material 6 of a kind different than the material of the substrate 9, the single crystalline layer 8 can be formed, followed by the same procedure as in the first embodiment, to prepare a solar battery.

FIGS. 7A–7F illustrate diagramatically the steps of a third embodiment of the process for preparing the solar battery according to the present invention.

Figure 7A:
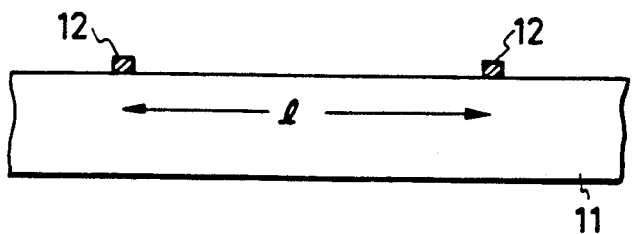
FIGS. 7A-7F illustrate diagramatically the steps of a third embodiment of the process for preparing the solar battery according to the present invention.
Figure 7B:
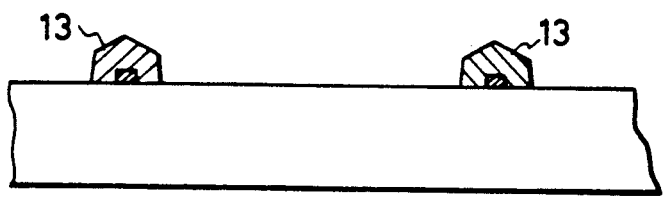

As shown in FIG. 7A, on an amorphous insulator substrate 11, nucleation surfaces consisting of a material of a different kind 12 which enable the above selective nucleation are formed sufficiently finely with a distance l apart from each other. The distance l is set at, for example, a size equal to or greater than the size of the single crystalline region required for obtaining the desired energy conversion efficiency.

Next, according to appropriate deposition conditions, a single nucleus of the thin film material is formed on each nucleation surface 12. Thus, the nucleation surface 12 is required to be formed sufficiently minutely to the extent which affords only formation of a single nucleus. The size of the nucleation surfaces 12, which may differ depending on the kind of the material, may be several microns or less. Further, the nuclei grow while maintaining the single crystalline structure, to become single crystalline grains 13 shaped as islands as shown in FIG.

7B. For forming the island-shaped single crystalline grains 13, it is necessary to determine the conditions so that no nucleation may occur on the substrate 11, as already described.

The crystal orientation of the island-shaped single crystalline grains 13 in the direction normal to the substrate is determined constantly so as to minimize the interfacial energy between the material of the substrate 11 and the thin film material to be deposited. This is because surface or interfacial energy has anisotropy depending on the crystal plane. However, as already mentioned, the crystal orientation within the substrate plane in an amorphous substrate is not determined.

Figure 7C:
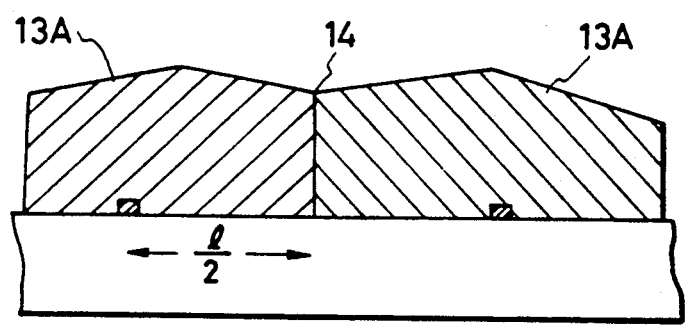

The island-shaped single crystalline grain 13 further grows to contact the adjacent single crystalline grain 13 as shown in FIG. 7C, but since the crystal orientation within the substrate plane is not constant, a crystal grain boundary 14 is formed at the intermediate position between the materials of different kind 12.

Figure 7D:
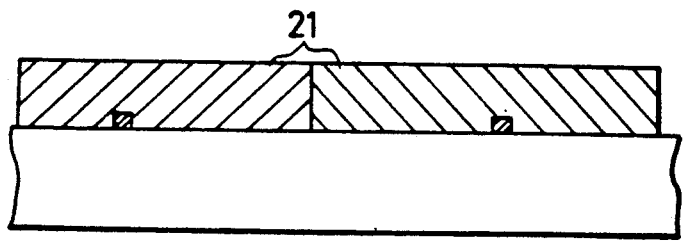

Subsequently, the single crystalline grain 13 grows three-dimensionally. Since the crystal planes with slow growth speed appear as facets, the surface is flattened by etching or polishing to form a polycrystalline layer 21 in which thin films of single crystals with predetermined sizes are continuously arranged through grain boundaries as shown in FIG. 7D. The size of the single crystalline thin film constituting the polycrystalline layer is determined by the distance l between the nucleation surfaces 12 as described above. That is, by determining appropriately the formation pattern of the nucleation surfaces 12, the positions of the grain boundaries can be controlled, whereby single crystals with desired sizes can be formed with a desired arrangement. The polycrystalline layer 21 is made the first conduction type similarly as in the above first embodiment to become the first electrode layer of the solar battery.

Figure 7E:
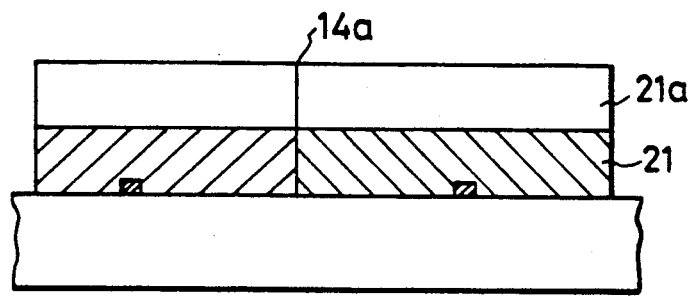

Next, similarly as in the above first embodiment, on the polycrystalline layer 21, a layer 21a with low impurity concentration which becomes the intermediate layer of the solar battery is formed as shown in FIG. 7E. In this step, a crystal grain boundary 14a is formed at the same position as the crystal grain boundary 14 of the polycrystalline layer 21 is formed by use of the above selective deposition method, and therefore the intermediate layer 21a becomes polycrystalline.

Figure 7F:
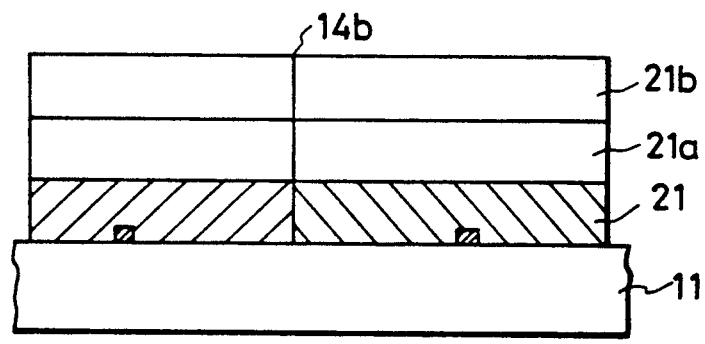

Subsequently, similarly as in the above first embodiment, on the above intermediate layer 21a the second electrode layer 21b of the solar battery is formed, as shown in FIG. 7F. In this step, a crystal grain boundary 14b is formed at the same position as the crystal grain boundary 14a of the intermediate layer 21a, and therefore the layer 21b becomes polycrystalline. The layer 21b is made the second conduction type.

As described above, since the selective nucleation method is used for formation of the first electrode layer, the crystal grain size can be controlled sufficiently well by the distance l between the nucleation surfaces 12 to obtain easily a polycrystalline layer having a large crystal grain size of several ten microns. For this reason, a polycrystalline type solar battery having an energy conversion efficiency approximate to the energy conversion efficiency of the solar batteries using a single crystalline layer can be obtained.

In this embodiment, similarly as in the above second embodiment, by use of a substrate 11 comprising a material with small nucleation density which enables selective deposition, the first electrode layer was formed directly on the surface of the substrate, but it is also possible to use the same nucleation surface as in the above first embodiment as the nucleation surface during selective nucleation. In this case, as already described, a polycrystalline layer can be formed without any restriction about the material, the structure, etc. of the substrate.

In the following, a specific method for forming the first electrode layer in the respective embodiments set forth above is to be described by referring primarily to the third embodiment shown in FIGS. 7A-7F.

A Si single crystalline wafer is thermally oxidized to form $SiO_2$ on the surface to provide a substrate 11. Of course, a quartz substrate may be used, and $SiO_2$ layer may also be formed on any desired substrate such as of metal, semiconductor, magnetic material, piezoelectric material, insulating material, etc. by use of the sputtering method, the CVD method, the vacuum vapor deposition method, etc. Also, although $SiO_2$ is desirable as the nucleation surface forming material, $SiO_x$ with the value of x being varied may be also available.

On the $SiO_2$ layer 11 thus formed, a silicon nitride layer (here $Si_3N_4$ layer) or a polycrystalline silicon layer is deposited by the reduced pressure CVD method, and the silicon nitride layer or the polycrystalline silicon layer is subjected to patterning by the conventional lithographic technique or the lithographic technique using X-ray, electron beam or ion beam to form fine nucleation surfaces 12 of several microns or less, desirably ca. 1 μm or less.

Subsequently, by use of a gas mixture of HCl, $H_2$ and $SiH_2Cl_2$, $SiCl_4$, $SiHCl_3$, $SiF_4$ or $SiH_4$, Si is permitted to grow selectively on the substrate 11. The substrate temperature during such growth may be 700° to 1100° C., and the pressure about 100 Torr.

Within a time of several tens of minutes, grains of single crystalline Si 13 grow with the fine nucleation surfaces 12 of silicon nitride or polycrystalline silicon on $SiO_2$ as the centers, and their sizes will grow to several tens of microns or greater by controlling optimally the growth conditions.

Subsequently, by reactive ion etching (RIE), the etching speed of which is different for Si and for $SiO_2$, only the Si is flattened by etching to form a polycrystalline silicon layer 21 having a controlled grain size. When unevenness of the surface of the single crystalline grain 13 is great, mechanical polishing is performed before etching.

Composition of Silicon Nitride

For obtaining sufficient nucleation density difference ($\Delta ND$) between the material ($M_S$) for formation of the nonnucleation surface ($S_{NDS}$) and the material ($M_L$) for formation of nucleation surface ($S_{NDL}$) as described above, for polycrystalline silicon or $SiO_2$ as the material for formation of nonnucleation surface ($S_{NDS}$) to be used in combination, the material for formation of the nucleation surface ($S_{NDL}$) is not limited to $Si_3N_4$, but silicon nitrides with various chemical composition ratios may be employed.

The chemical composition ratio of silicon nitride may be varied, for example, as follows.

In the plasma CVD method for forming silicon nitride film at low temperature by decomposition of $SiH_4$ gas and $NH_3$ in RF plasma, by varying the flow rate ratio of $SiH_4$ gas and $NH_3$ gas, the composition ratio of Si and N in the deposited silicon nitride film can be varied to a great extent.

Figure 8:
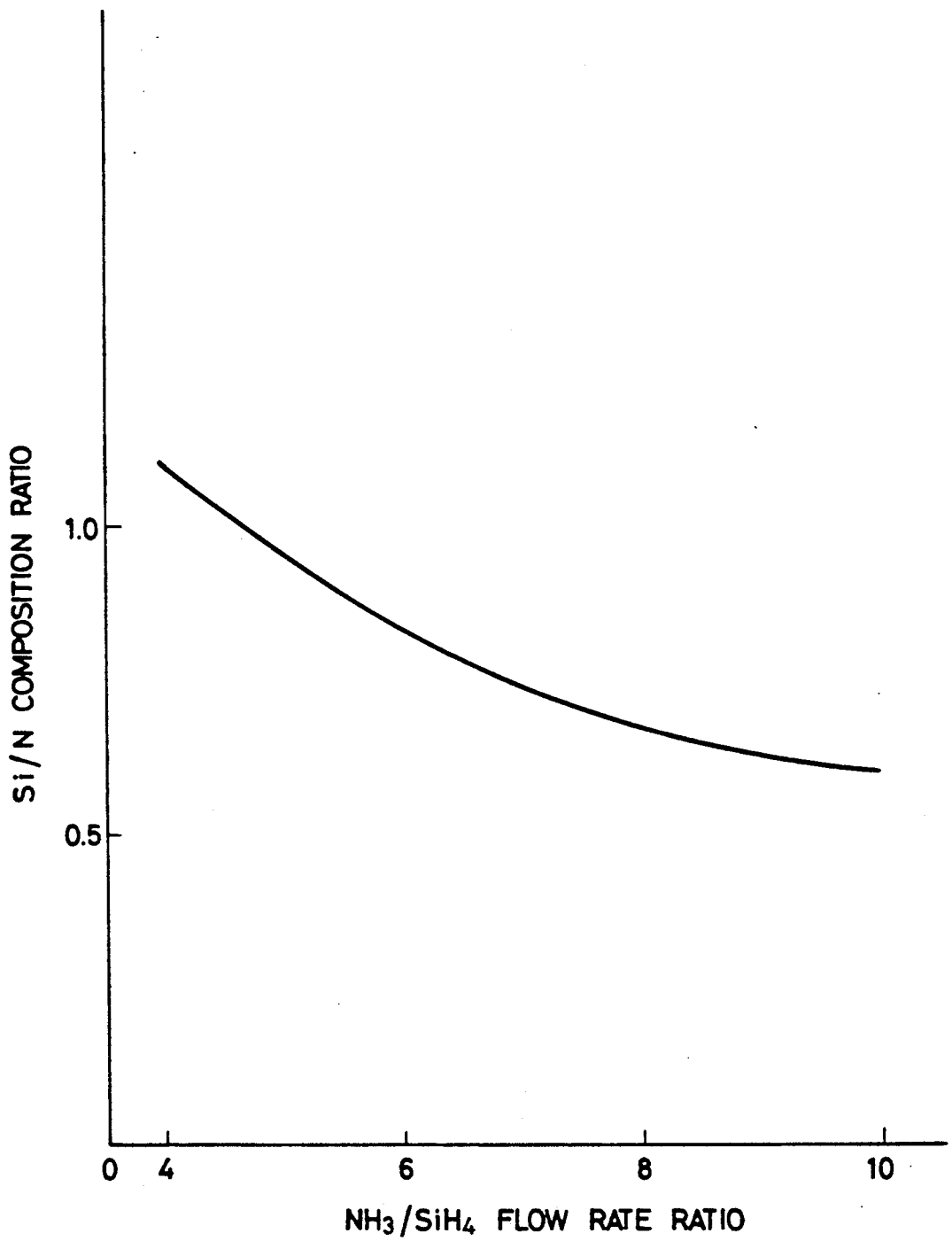
FIG. 8 is a graph showing the relationship between the flow rate ratio of $SiH_4$ and $NH_3$ and the composition ratio of Si and N in the silicon nitride film formed.

FIG. 8 is a graph showing an example of the relationship between the flow rate ratio of SiH$_4$ and NH$_3$ and the composition ratio of Si and N in the silicon nitride film formed.

The deposition conditions at this time were RF output of 175 W, substrate temperature of 380° C. and the flow rate of NH$_3$ gas was varied with the SiH$_4$ gas flow rate being fixed at cc/min. As shown in the same graph, by varying the gas flow rate ratio of NH$_3$/SiH$_4$ from 4 to 10, the Si/N ratio in the silicon nitride film was found to be varied from 1.1 to 1.58 according to Auger electron spectrophotometry.

On the other hand, the composition of the silicon nitride film formed according to the reduced pressure CVD method by introducing SiH$_2$Cl$_2$ gas and NH$_3$ gas under the conditions of a reduced pressure of 0.3 Torr and a temperature of about 800° C. was found to be Si$_3$N$_4$ (Si/N=0.75) which is approximately the stoichiometric ratio.

Also, the silicon nitride film formed by heat treatment at about 1200° C. in ammonia or N$_2$ (hot nitrification method) can be obtained with a composition further approximate to the stoichiometric ratio, since the formation method is performed under thermal equilibrium.

By use of silicon nitrides formed by the various methods as described above as the material for forming nucleation surface ($S_{NDL}$) with higher nucleation density than SiO$_2$, the above nucleus of Si can be grown on the nucleation surface ($S_{NDL}$) comprising silicon nitride to form Si single crystal based on the nucleation density (ND) corresponding to the chemical composition ratio of silicon nitride.

Figure 9:
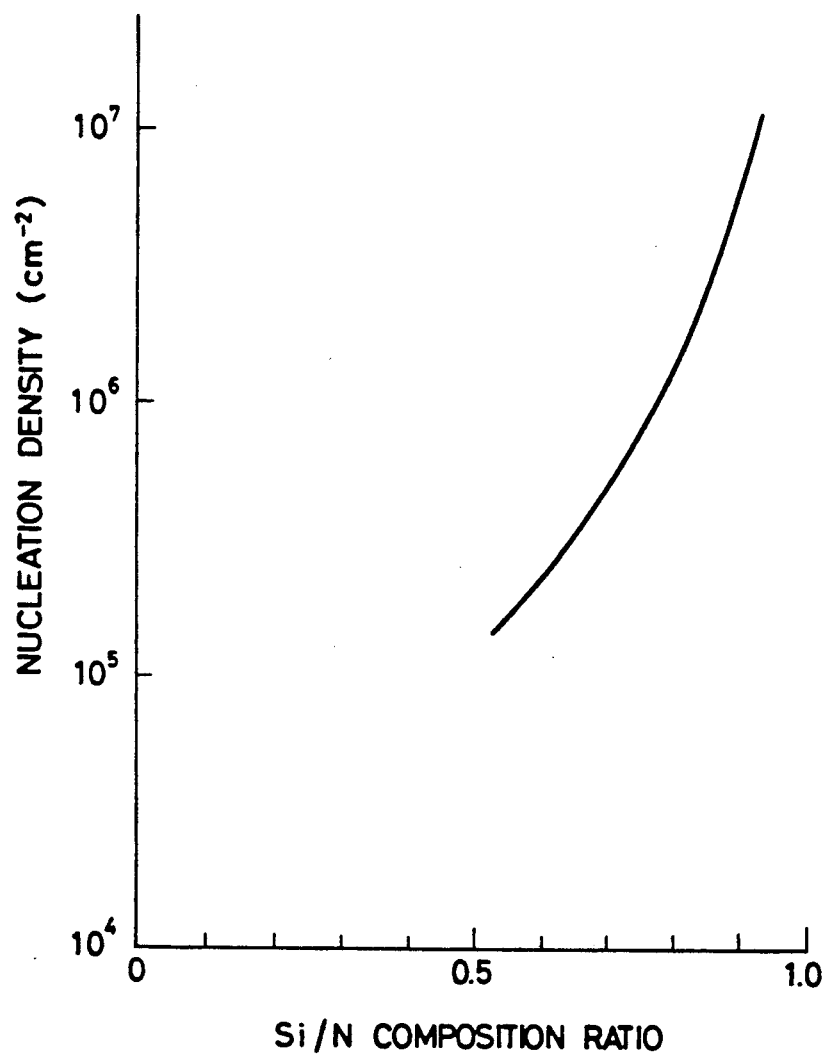
FIG. 9 is a graph showing the relationship between the Si/N composition ratio and the nucleation density.

FIG. 9 is a graph showing the relationship between Si/N composition ratio and nucleation density (ND). As shown in the same graph, by varying the chemical composition ratio of the silicon nitride film, the nucleation density of the Si single crystal nucleus formed thereon changes to a great extent. The nucleation conditions in the graph shown in FIG. 9 correspond to the case when Si single crystal nucleus was formed by reacting SiCl$_4$ gas reduced to 175 Torr with H$_2$ at 100° C. Of course, another graph will be obtained if nucleation conditions such as gas species, pressure, temperature, etc., are changed.

The phenomenon that the nucleation density thus changes according to the chemical composition ratio of silicon nitride affects the size (area) of the nucleation surface ($S_{NDL}$) when employing silicon nitride as the material for forming the nucleation surface ($S_{NDL}$) which is formed sufficiently finely to the extent that a single nucleus may be grown. That is, when employing silicon nitride having a composition with great nucleation density (ND) only a single crystal can be formed on the nucleation surface ($S_{NDL}$) by forming the nucleation surface ($S_{NDL}$) extremely finely as compared with the silicon nitride with relatively smaller nucleation density (ND). This concept is applicable for other materials for forming the nucleation surface ($S_{NDL}$). Accordingly, in the present invention, for accomplishing its objects effectively, it is desirable to select a nucleation density (ND) and a size of nucleation surface ($S_{NDL}$) formed of silicon nitride, etc., capable of forming only a single crystal suitably as desired. For example, under the nucleation condition for obtaining a nucleation density (ND) of about $10^5$ cm$^{-2}$ or less, it is possible to form selectively, only a single nucleus, if the size of the nucleation surface ($S_{NDL}$) comprising silicon nitride is about 4 μm or less. The Si/N ratio in that case is about 0.5.

Formation of Nucleation Surface ($S_{NDL}$) By Ion Injection

As another method for realizing nucleation density difference ΔND when forming a Si single crystal nucleus, ion injection of Si, N, P, B, F, Ar, He, C, As, Ga, Ge, etc., may be effected locally onto the surface comprising SiO$_2$ which is a material for forming a nonnucleation surface ($S_{NDS}$) with small nucleation density to form a modified region with a desired size on the SiO$_2$ surface, and utilize this modified region as the nucleation surface ($S_{NDL}$) with greater nucleation density (ND).

For example, the SiO$_2$ layer surface is covered with a photoresist layer and the desired portions are exposed, developed and dissolved to have the SiO$_2$ layer surface exposed.

Subsequently, by use of SiF$_4$ gas as the source gas, Si ions of 10 keV are implanted onto the SiO$_2$ layer surface at a density of $1 \times 10^{16} \sim 1 \times 10^{18}$ cm$^{-2}$. The projected flight distance in this case is 114 Å, and the Si concentration on the exposed surface of SiO$_2$ layer reaches about $10^{22}$ cm$^{-3}$ or less. Since the SiO$_2$ layer is originally amorphous, the modified layer made excessively enriched in Si by injection of Si ions is also amorphous.

For formation of a modified region, ion injection can be effected with the use of a resist as the mask, but it is also possible to inject a narrowed Si ion beam selectively at a desired position on the SiO$_2$ layer surface within a desired area without use of a resist mark by use of a converged ion beam technique.

After having thus effected Si ion implantation, by peeling off of the resist on the remaining portion, an excess Si modified region is formed on the surface portion of the SiO$_2$ layer at a desired position with a desired size. On the modified region of the SiO$_2$ layer surface portion having such modified region formed, Si single crystal is permitted to grow in the vapor phase.

Figure 10:
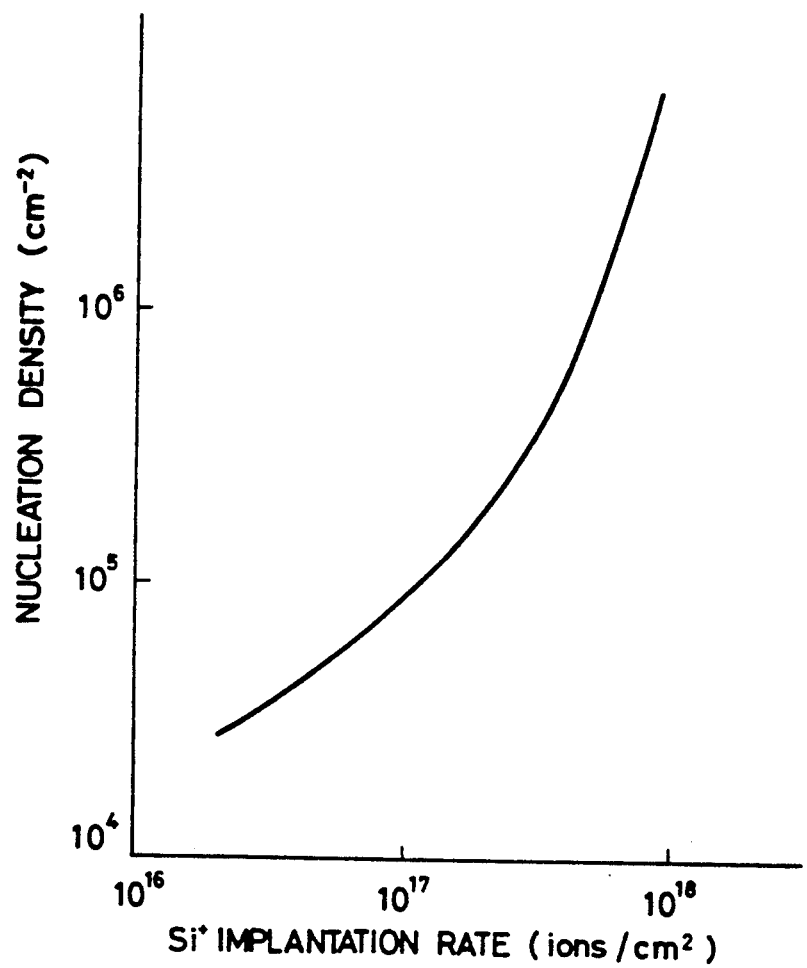
FIG. 10 is a graph showing the relationship between the amount of $Si^-$ ions implanted and the nucleation density.

FIG. 10 is a graph showing the relationship between the amount of Si ions injected and nucleation density (ND).

As shown in the same graph, it can be understood that nucleation density (ND) is increased as the amount of Si$^+$ injected increases.

Accordingly, by forming a modified region sufficiently finely, only a single nucleus of Si can be grown with the modified region acting as the nucleation surface ($S_{NDL}$), whereby a single crystal can be grown as described above.

It can be easily accomplished by patterning of a resist or narrowing of beam of the converged ion beam to form the modified region sufficiently finely to the extent that only a single nucleus may grow.

Method for Formation of Si Single Crystal Nucleus Other than CVD

For growth of a single crystal by selective nucleation of Si, not only the CVD method, but also the vacuum evaporation of Si ($<10^{-6}$ Torr) with an electron gun and deposition on a heated substrate may be used. Particularly, in the MBE (Molecular Beam Epitaxy) method which performs vapor deposition in ultra-high vacuum ($<10^9$ Torr), it has been known that the Si beam begins to react with SiO$_2$ at a substrate temperature of 900° C. or higher, whereby no nucleation of Si occurs on SiO$_2$ at all (T. Yonehara, S. Yoshioka and S.

Miyazawa, Journal of Applied Physics, 53 (10), 6839, (1983)).

By utilizing this phenomenon, single crystal nuclei of Si can be formed with perfect selectivity on the fine silicon nitride regions permitted to exist in spots on the $SiO_2$ layer, and single crystal Si can be grown from the nuclei. The preferred single crystal growth conditions at this time may be, for example, a vacuum degree of $10^{-8}$ Torr or lower, Si beam intensity of $9.7 \times 10^{14}$ atoms/cm$^2$·sec, and a substrate temperature of 900° C.~1000° C.

In this case, through the reaction $SiO_2 + Si \rightarrow 2SiO \uparrow$, a reaction product of SiO with a remarkably high vapor pressure is formed, and etching of $SiO_2$ by Si.

In contrast, no such etching phenomenon as mentioned above occurs on silicon nitride, but nucleation of Si single crystal and growth of single crystal occur.

Accordingly, as the material for forming nucleation surface ($S_{NDL}$) with high nucleation density (ND), tantalum oxide ($Ta_2O_5$), silicon nitride oxide (SiON), etc., can be also used other than silicon nitride to obtain the same effect. That is, by forming the above nucleation surface ($S_{NDL}$) with these materials in fine areas, single crystals of Si can be permitted to grow similarly.

The combinations of the nucleation surface forming material and the nonnucleation surface forming material of different kind described herein are not limited to those as shown in the above embodiments, but it is evident that any combination of the materials having a sufficient difference in nucleation density may be available. Accordingly, it is also possible to obtain the solar battery of the present invention by use of a compound semiconductor such as GaAs, InP, etc. which can be used for selective nucleation.

As described in detail above, according to the present invention, formation of an electrode layer which has a large crystal grain size and is sufficiently thin is possible, and a solar battery having sufficiently high energy conversion efficiency can be obtained.

Also, according to the present invention, a solar battery with good performances can be prepared at low cost easily and stably by use of a method analogous to conventional IC preparation processes.

We claim:

1. A solar battery comprising:
   (a) a substrate, a first semiconductor layer of a first conductivity type including a single crystal grown on a nucleation surface ($S_{NDL}$) formed on a small area of the surface of said substrate as the base for said single crystal growth, said nucleation surface ($S_{NDL}$) being comprised of an amorphous material which is sufficiently greater in nucleation density (ND) than the material constituting the surface of said substrate and having a sufficiently small area so as to form only a single nucleus from which said single crystal is grown; said nucleation surface positioned on said substrate so as to grow said single crystal to a desired size;
   (b) an overlying second semiconductor layer of a second conductivity type different than the conduction conductivity type of said first semiconductor layer; and
   (c) means for outputting the power generated by said solar battery.

2. The solar battery according to claim 1, wherein a third single crystalline semiconductor layer having an impurity concentration lower than that of said first semiconductor layer is formed on said first semiconductor layer, and said second semiconductor layer is formed on the third semiconductor layer.

3. The solar battery according to claim 1, wherein a plural number of pairs of said first semiconductor layer and said second semiconductor layer are formed on the surface of said substrate.

4. The solar battery according to claim 1, wherein said first semiconductor layer is comprised of silicon.

5. The solar battery of claim 1, wherein the material comprising the nucleation surface is silicon nitride.

6. The solar battery of claim 1, wherein the material comprising the nucleation surface is ion-implanted silicon oxide.

7. The solar battery of claim 1, wherein the substrate is comprised of an amorphous insulating material.

8. The solar battery of claim 1, wherein the first semiconductor layer includes an electrode.

9. The solar battery of claim 1, wherein the second semiconductor layer includes an electrode.

10. A process for preparing a solar battery comprising:
    (a) forming a nucleation surface ($S_{NDL}$) on a small area of the surface of a substrate, said nucleation surface ($S_{NDL}$) being comprised of an amorphous material which is sufficiently greater in nucleation density (ND) than the material constituting the surface of said substrate and having a sufficiently small area so as to form only a single nucleus from which a first semiconductor layer of a first conductivity type including a single crystal is later grown, said nucleation surface positioned on said substrate so as to permit growth of said single crystal to a desired size;
    (b) applying crystal forming treatment to said substrate to form said single nucleus on the nucleation surface and growing said first semiconductor layer including said single crystal from the single nucleus; and
    (c) forming a second semiconductor layer of a second conductivity type on said first semiconductor layer.

11. The process according to claim 7, further comprising forming on said first semiconductor layer a third single crystalline semiconductor layer having an impurity concentration lower than that of said first semiconductor layer in advance of the formation of said second semiconductor layer.

12. The process according to claim 7, wherein a plural number of pairs of said first semiconductor layer and said second semiconductor layer are formed on the surface of said substrate.

13. The process of claim 7, wherein the crystal forming treatment is a vapor phase method.

14. The process of claim 7, wherein the crystal forming treatment is a chemical vapor deposition method.

15. The process of claim 7, wherein the crystal forming treatment is a vapor deposition method.

16. The process of claim 7, wherein the material comprising the nucleation surface is silicon nitride.

17. The process of claim 7, wherein the material comprising the nucleation surface is ion-implanted silicon oxide.

18. The process of claim 7, wherein the substrate is comprised of an amorphous insulating material.

* * * * *

UNITED STATES PATENT AND TRADEMARK OFFICE
CERTIFICATE OF CORRECTION

PATENT NO. : 5,087,296
DATED : February 11, 1992
INVENTOR(S) : SHIGEKI KONDO, ET AL.

It is certified that error appears in the above-identified patent and that said Letters Patent is hereby corrected as shown below:

COLUMN 1

Line 46, "hundredth" should read --hundredths of--.

COLUMN 2

Line 5, "a" should read --at--.
Line 29, "diagramatically" should read --diagrammatically--.
Line 34, "diagramatically" should read --diagrammatically--.
Line 37, "diagramatically" should read --diagrammatically--.
Line 46, "Si$^-$ ions" should read --Si$^+$ ions--.

COLUMN 3

Line 5, "$G=4\pi f(\Lambda)(\sigma or^2+\frac{1}{3}\cdot gv\cdot R^3)$" should read
--$G=4\pi f(\theta)(\sigma or^2+\frac{1}{3}\cdot gv\cdot r^3)$--.
Line 13, "$\theta o:$" should read --$\sigma o:$--.
Line 39, "mutually" should be deleted.
Line 42, "difficulty" should read --difficultly--.

COLUMN 4

Line 16, "100°" should read --1000°--.
Line 17, "$SiH_2Cl_2$," should read --$SiH_4$, $SiH_2Cl_2$--.
Line 34, "(1982)." should read --(1982)).--.

COLUMN 5

Line 5, "diagramatically" should read --diagrammatically--.

UNITED STATES PATENT AND TRADEMARK OFFICE
CERTIFICATE OF CORRECTION

PATENT NO. : 5,087,296
DATED : February 11, 1992
INVENTOR(S) : SHIGEKI KONDO, ET AL.

It is certified that error appears in the above-identified patent and that said Letters Patent is hereby corrected as shown below:

COLUMN 6

Line 39, "diagramatically" should read --diagrammatically--.
Line 48, "diagramatically" should read --diagrammatically--.

COLUMN 7

Line 43, "is" should be deleted.
Line 59, "ten" should read --tens of--.

COLUMN 9

Line 41, "100°C." should read --1000°C.--.

COLUMN 10

Line 7, "$\Delta$ND)" should read --($\Delta$ND)--.
Line 32, "mark" should read --mask--.
Line 36, "Si modified" should read --Si-modified--.
Line 65, "(<$10^9$ Torr)," should read --(<$10^{-9}$ Torr),--.

COLUMN 11

Line 14, "Si." should read --Si occurs.--.

COLUMN 12

Line 44, "claim 7," should read --claim 10,--.
Line 50, "claim 7," should read --claim 10,--.
Line 54, "claim 7," should read --claim 10,--.
Line 56, "claim 7," should read --claim 10,--.

UNITED STATES PATENT AND TRADEMARK OFFICE
CERTIFICATE OF CORRECTION

PATENT NO. : 5,087,296
DATED : February 11, 1992
INVENTOR(S) : SHIGEKI KONDO, ET AL.

It is certified that error appears in the above-identified patent and that said Letters Patent is hereby corrected as shown below:

COLUMN 12

```
Line 58, "claim 7," should read --claim 10,--.
Line 60, "claim 7," should read --claim 10,--.
Line 62, "claim 7," should read --claim 10,--.
Line 65, "claim 7," should read --claim 10,--.
```

Signed and Sealed this

Twenty-fourth Day of August, 1993

Attest:

*Attesting Officer*

BRUCE LEHMAN

*Commissioner of Patents and Trademarks*